United States Patent
Gotoh et al.

(10) Patent No.: US 6,417,026 B2
(45) Date of Patent: Jul. 9, 2002

(54) ACOUSTIC WAVE DEVICE FACE-DOWN MOUNTED ON A SUBSTRATE

(75) Inventors: Masashi Gotoh; Jitsuo Kanazawa, both of Ibaraki; Hajime Kuwajima, Tokyo, all of (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/754,327

(22) Filed: Jan. 5, 2001

Related U.S. Application Data

(62) Division of application No. 09/255,018, filed on Feb. 22, 1999, now Pat. No. 6,181,015.

(30) Foreign Application Priority Data

Feb. 27, 1998 (JP) ............................................. 10-64511

(51) Int. Cl.$^7$ ............................................. H01L 21/48
(52) U.S. Cl. ...................... 438/108; 438/119; 438/124; 438/126; 438/127
(58) Field of Search .................................. 438/106, 108, 438/109, 119, 124, 126, 127; 257/737, 738, 774, 780, 781, 786; 361/761, 764, 765; 228/180.22

(56) References Cited

U.S. PATENT DOCUMENTS

| | | | |
|---|---|---|---|
| 3,885,173 A | 5/1975 | Lee | |
| 5,459,368 A | * 10/1995 | Onishi et al. | 310/313 |
| 5,699,027 A | * 12/1997 | Tsuji et al. | 333/193 |
| 5,757,078 A | 5/1998 | Matasuda et al. | |
| 5,821,665 A | * 10/1998 | Onishi et al. | 310/313 |
| 5,969,461 A | * 10/1999 | Anderson et al. | 310/313 |
| 5,991,989 A | * 11/1999 | Onishi et al. | 29/25.35 |
| 6,181,015 B1 | * 1/2001 | Gotoh et al. | 257/778 |
| 6,262,513 B1 | * 7/2001 | Furukawa et al. | 310/313 |

FOREIGN PATENT DOCUMENTS

| | | |
|---|---|---|
| EP | 0 740 343 | 10/1996 |
| JP | 5-55303 | 3/1993 |
| JP | 5-291864 | * 11/1993 |
| JP | 7-99420 | * 4/1995 |
| JP | 8-307197 | 11/1996 |
| JP | 9-246905 | 9/1997 |
| JP | 11-074755 | 3/1999 |

OTHER PUBLICATIONS

Patent Abstracts of Japan, vol. 007, No. 251 (E–209), Nov. 8, 1983, JP 58 138115, Aug. 16, 1983.
Patent Abstracts of Japan, vol. 016, No. 526 (E–1286), Oct. 28, 1992, JP 04 196612, Jul. 16, 1992.
Patent Abstracts of Japan, vol. 014, No. 328 (E–0952), Jul. 13, 1990, JP 02 111113, Apr. 24, 1990.

* cited by examiner

*Primary Examiner*—Olik Chaudhuri
*Assistant Examiner*—Alonzo Chambliss
(74) *Attorney, Agent, or Firm*—Oblon, Spivak, McClelland, Maier & Neustadt, P.C.

(57) ABSTRACT

In a chip device in which not only an electrode pattern 25 is provided on a main mounting surface 21a of a base 21 but also bump electrodes 22 are provided as external electrodes for face-down mounting, an electrically insulating layer 31 is provided to be put on at least a part of the main mounting surface 21a so as to remain edge portions which do not cover at least a part of the electrode pattern 25, and a protection layer 32 for protecting the main mounting surface is further provided at a distance from the main mounting surface 21a so as to be put on the electrically insulating layer 31, so that the bump electrodes 22 are connected to the electrode pattern 25 while being in contact with the edge portions of the electrically insulating layer 31 and the protection layer 32.

6 Claims, 4 Drawing Sheets

PRIOR ART FIG. 6
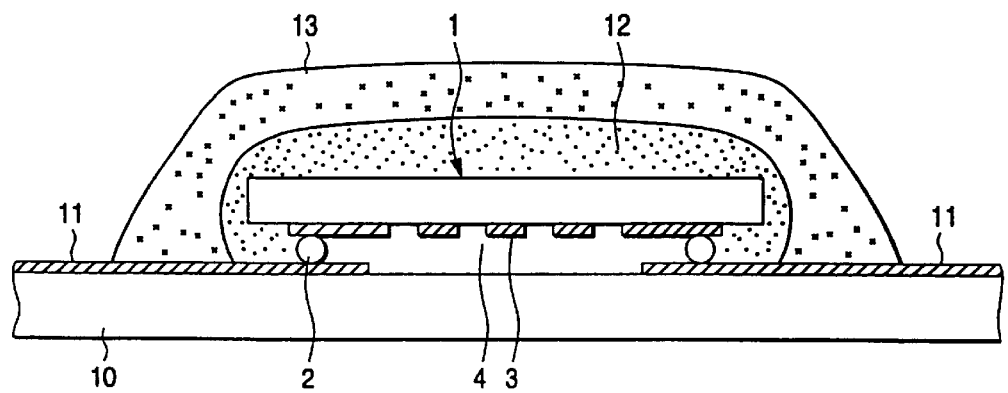
PRIOR ART FIG. 7
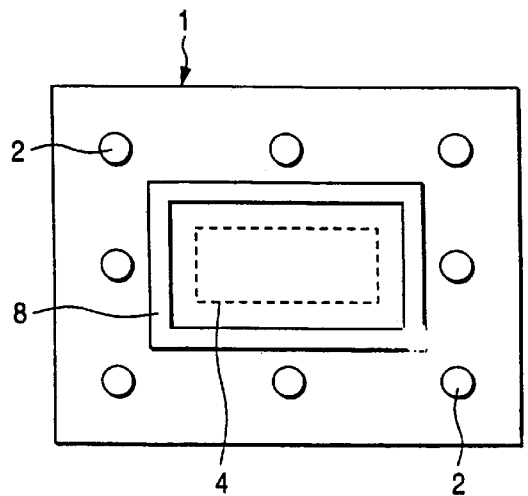
PRIOR ART FIG. 8
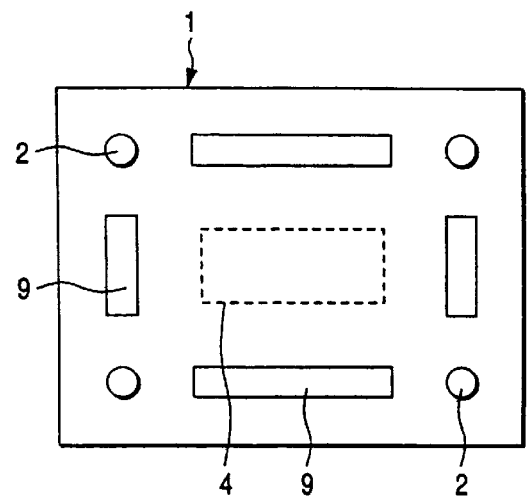

ACOUSTIC WAVE DEVICE FACE-DOWN MOUNTED ON A SUBSTRATE

CROSS-REFERENCE TO RELATED APPLICATIONS

This is a divisional application of Ser. No. 09/255,018 filed Feb. 22, 1999, now U.S. Pat. No. 6,181,015.

BACKGROUND OF THE INVENTION

The present invention relates to a chip device such as a surface acoustic wave device, or the like, face-down mounted on a mount-side substrate (subject mounting substrate) such as a circuit substrate of an electronic appliance, a package substrate having a wiring circuit formed thereon, or the like, and further relates to a method for producing the chip device.

In recent years, a high-density mounting method has become popular, in which bump electrodes (external electrodes) of various chip devices such as an inductor (L device), a capacitor (C device), a resistor (R device), a surface acoustic wave device, etc. as well as a semiconductor device, are face-down mounted on a circuit substrate of an electronic appliance. To attain further reduction in size and weight of electronic appliances in future, there are required a chip device having bump electrodes capable of being smaller-sized, and a method for producing the chip device. The background art will be described below with respect to a surface acoustic wave device recently widely used in a mobile radio communication appliance, a navigation system, etc., by way of example.

FIG. 6 is a sectional view showing a conventional surface acoustic wave device 1 face-down mounted on a circuit substrate 10 as a subject mounting substrate through bump electrodes 2. An active region 4 having comb-like electrodes 3 is formed on a main mounting surface of the surface acoustic wave device 1. The comb electrodes 3 are connected to a conductor pattern 11 of the circuit substrate 10 through the bump electrodes 2 via an electrode pattern which is not shown but formed on the main mounting surface of the surface acoustic wave device. Incidentally, the electrode bumps 2 are connected to a ground pattern, or the like, of the surface acoustic wave device as well as the comb electrodes. In this manner, the surface acoustic wave device 1 is face-down mounted by means of ultrasonic bonding or by use of electrically conductive resin, solder, or the like, so that the active region 4 comes face to face with a conductor pattern surface of the circuit substrate 10.

After face-down mounted on the circuit substrate 10, the aforementioned surface acoustic wave device 1 as a chip device is generally sealed and protected with a buffer resin 12 such as silicone resin, or the like, for the double purpose of stress relaxation and electrical insulation and with an exterior resin 13 such as epoxy resin, or the like, for the main purpose of mechanical protection and intensification of moisture resistance.

According to the aforementioned method in which the chip device face-down mounted on the circuit substrate is sealed with resin, however, the buffer resin intruded between the chip device and the circuit substrate is expanded because of temperature change, swelling, etc. to destroy small junctions by means of the bump electrodes to thereby worsen reliability. Particularly, the resin intruded between the surface acoustic wave device and the circuit substrate is deposited on a surface of the active region to thereby worsen the performance of the surface acoustic wave device. As shown in FIGS. 7 and 8, therefore, a countermeasure to prevent the influx of the resin is attained so that a dam is provided between an upper surface of the circuit substrate and the main mounting surface of the chip device to form a closed space. FIG. 7 is a plan view showing an example in which not only bump electrodes 2 are provided on the main mounting surface of the surface acoustic wave device 1 but also a dam frame 8 is provided so as to surround the active region 4. FIG. 8 is a plan view showing an example in which discontinuous barriers 9 are formed in some important positions between bump electrodes 2 provided on the main mounting surface of the surface acoustic wave device 1. Incidentally, an example of the aforementioned structure of the surface acoustic wave device can be found in JP-A-5-55303, etc.

To reduce the size of the chip device more greatly to achieve high-density mounting such as high-reliable multi-chip on-board, or the like, however, the following unsolved problems have remained still in the aforementioned background art.

According to the background art, the dam and the bump electrodes were formed separately on the chip device. Accordingly, an area for providing the dam was required on the chip device. Because a width of 1 or several millimeters was required to provide the dam frame or the barriers having a sufficient strength, there was a defect that the resulting shape of the chip device became large.

Further, because the dam and the bump electrodes were formed separately, the respective heights of the dam and the bump electrodes on the chip device became uneven. There was therefore a problem that no closed space could be formed when the chip device was facedown mounted on the circuit substrate.

Of course, the discontinuous barriers cannot prevent the influx of the resin perfectly.

Further, it is necessary to reduce the size of the bump electrodes in order to further reduce the size of the chip device, but the strength of the bump electrodes is weakened if the size of the bump electrodes is reduced.

Generally, according to the aforementioned background art, there has remained a problem that it is impossible to provide any chip device in which high-density mounting can be attained by greater reduction in size of the chip device.

Incidentally, as a further background art, JP-A-9-246905 has proposed a structure in which not only an enclosure wall is provided so as to enclose the active region of the surface acoustic wave device but also an upper space enclosed by the enclosure wall is covered with a cover body. Also in this case, however, the size of the device is increased because bump electrodes are disposed in the outside of the enclosure wall. Furthermore, because the bump electrodes are in positions far from the enclosure wall so as not to be reinforced by the enclosure wall, or the like, the size of the bump electrodes is required to be increased so that the bump electrodes have tolerance to stress at the time of bonding and have a necessary fixation strength. Accordingly, it is difficult to advance the reduction in size of the bump electrodes.

Further, according to the aforementioned background art, it is difficult to make the heights of a plurality of bump electrodes uniform because the plurality of bump electrodes are formed on the main mounting surface by means of bonding or by use of balls, or the like.

SUMMARY OF THE INVENTION

This invention is designed on the basis of such a knowledge that, when the chip device is face-down mounted on the mount-side substrate, it is only required to provide a gap of several micrometers in the minimum between a main mounting surface of a chip device and a mount-side substrate such as a circuit substrate, or the like. That is, it is an object of the present invention to provide a chip device in which both the reduction in size of external electrodes as bump electrodes and the reduction in external size of the chip device can be attained to thereby achieve high-density mounting to solve the aforementioned problems, and a method for producing the chip device.

In order to achieve the above object according to an aspect of the present invention, provided is a chip device in which not only an electrode pattern is provided on a main mounting surface of a base but also external electrodes are provided for face-down mounting, characterized in that at least one electrically insulating layer is provided to be put on at least a part of the main mounting surface so as to remain edge portions which do not cover at least apart of the electrode pattern, so that the external electrodes are connected to the electrode pattern while the external electrodes are in contact with the edge portions of the electrically insulating layer.

In the chip device according to the present invention, the edge portion of the electrically insulating layer put on the main mounting surface of the chip device so as to have a predetermined thickness serves to support the external electrode mechanically. Accordingly, the size of the external electrodes can be reduced, for example, to the order of micrometers or the order of tens of micrometers as the diameter. Incidentally, the electrically insulating layer may be formed by materials other than an inorganic material (SiO2) or an organic material such as polyimide, or the like. Further, the external electrodes are not required to be shaped independently, so that the external electrodes may be formed by a thin-film formation method, a thick-film paste printing method, or the like.

In the above chip device, preferably, the electrically insulating layer may include a first electrically insulating layer forming a frame body, and a second electrically insulating layer provided at a distance from the main mounting surface so as to be put on the first electrically insulating layer to protect the main mounting surface.

In this manner, the main mounting surface is covered with the second electrically insulating layer at a gap from the main mounting surface, so that the main mounting surface is protected. Accordingly, not only the chip device becomes easy to handle but also the deposition of foreign matters and the contamination with foreign matters can be prevented. Accordingly, the reliability of the chip device can be enhanced.

In the above chip device, preferably, the main mounting surface may have an active region in which comb-like electrodes for a surface acoustic wave device are formed as a part of the electrode pattern, and the electrically insulating layer is interposed between the main mounting surface and a mount-side substrate while avoiding the active region and comes into close contact with the mount-side substrate to thereby form a closed space which encloses the active region.

According to this configuration, the electrically insulating layer which is formed to a thickness, for example, of from 3 µm to 30 µm while avoiding the active region serves as a dam to prevent the intrusion of the sealing resin into the active region. Accordingly, even in the case where resin sealing is performed after a surface acoustic wave device in the form of a bare chip is face-down mounted on a mount-side substrate, the characteristic of the surface acoustic wave device never deteriorates.

According to another aspect of the present invention, provided is a method for producing a chip device in which external electrodes for face-down mounting are provided on a main mounting surface of a base after an electrode pattern is provided on the main mounting surface, characterized by comprising: an electrically insulating layer formation step of forming at least one electrically insulating layer with a predetermined thickness to be put on at least a part of the main mounting surface so as to remain edge portions which do not cover at least a part of the electrode pattern, and an external electrode formation step of forming external electrodes so that one end of each of the external electrodes is connected to the electrode pattern while the external electrodes are in contact with the edge portions of the electrically insulating layer.

In the method for producing a chip device according to the present invention, the edge portion formed in the electrically insulating layer formation step and the external electrodes formed in the external electrode formation step serve to define the positions and shapes with each other.

In the above method for producing a chip device, preferably, the method may further comprise a face-down mounting step of bonding the external electrodes to a mount-side substrate to thereby perform face-down mounting after the external electrode formation step, so that not only the external electrodes are connected to a conductor pattern of the mount-side substrate but also the electrically insulating layer is brought into close contact with both the main mounting surface and the surface of the mount-side substrate in the face-down mounting step.

In this case, the external electrodes come in close contact with the edge portions of the electrically insulating layer when the external electrodes are bonded. Accordingly, the external electrodes and the edge portions of the electrically insulating layer serve to reinforce each other against deformation of anyone of them, so that the bonding strength between the external electrodes and the conductor pattern is enhanced. Furthermore, when an adhesive resin is used, the electrically insulating layer which is interposed between the chip device and the mount-side substrate fulfills contracting force to attract the two to each other so that the electrically insulating layer serves to enhance mounting strength.

BRIEF DESCRIPTION OF THE DRAWINGS

FIG. 6 is a sectional view showing a background-art chip device;

FIG. 7 is a plan view showing the background art; and

FIG. 8 is a plan view showing another background art example of the chip device.

DETAILED DESCRIPTION OF THE PREFERRED EMBODIMENTS

Embodiments of a chip device and a method for producing the chip device according to the present invention will be described below with reference to the drawings.

Figure 1:
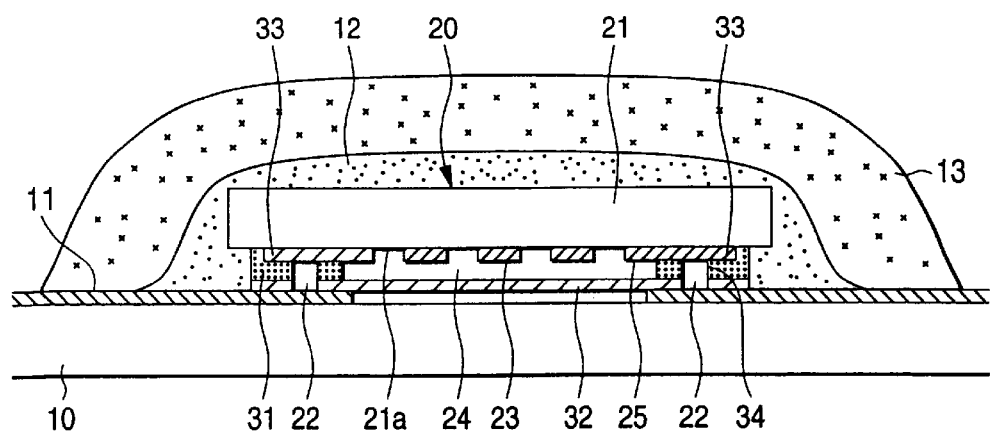
FIG. 1 is a sectional view showing an embodiment of the present invention in the state in which a chip device is face-down mounted onto a circuit substrate.
Figure 2:
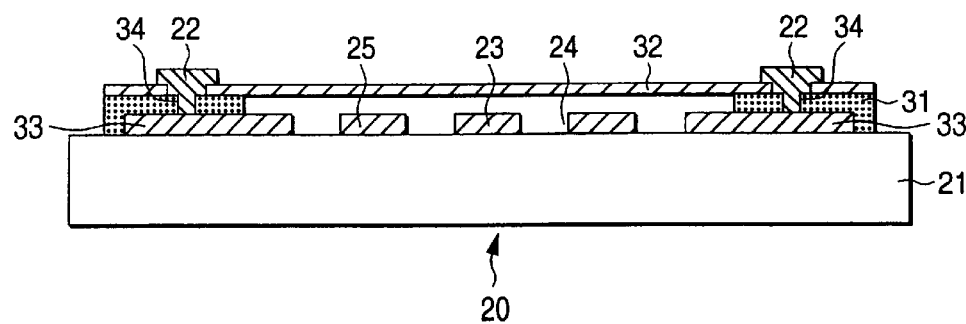
FIG. 2 is a sectional view of the chip device in the embodiment of the present invention.
Figure 3:
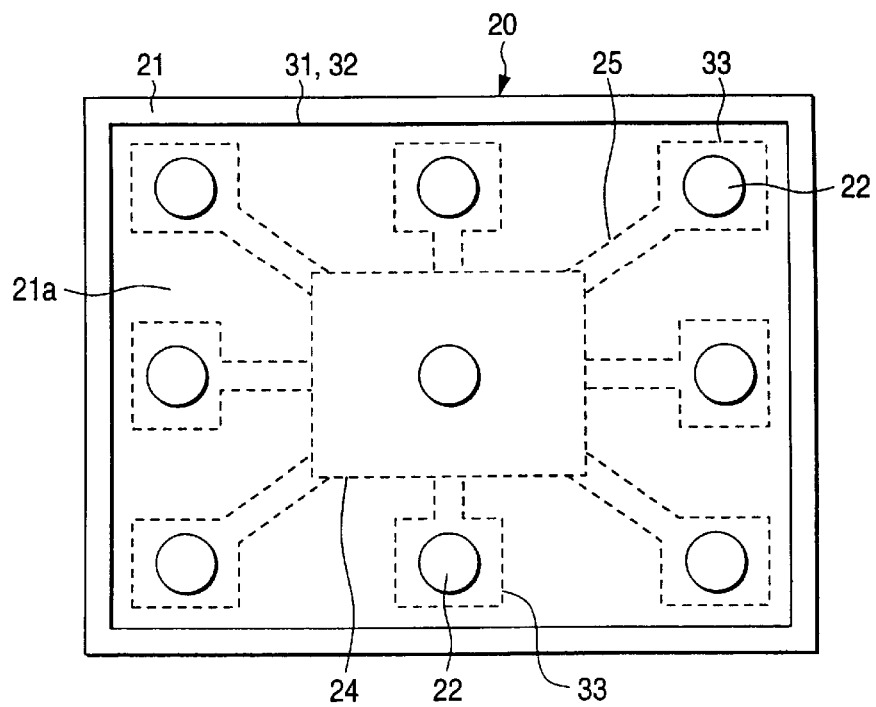
FIG. 3 is a plan view of the chip device.

FIG. 1 is a sectional view in the case where a surface acoustic wave device as a specific example of the chip device is facedown mounted on a circuit substrate as a mount-side substrate (subject mounting substrate). FIG. 2 is a sectional view of the surface acoustic wave device. FIG. 3 is a plan view of the surface acoustic wave device.

In these drawings, the surface acoustic wave device 20 has a structure in which an electrode pattern 25 containing comb electrodes 23, a ground pattern not shown, etc. is disposed, by aluminum vapor deposition, or the like, on a main mounting surface 21a which is one side surface of a piezoelectric substrate (base of the device) 21 made of lithium niobate crystal, lithium tantalate crystal, or the like. An active region 24 having the comb-like electrodes 23 is formed on the main mounting surface 21a. Electrode pattern portions extended from the comb electrodes 23, the ground pattern, etc. form pads 33 as shown in FIG. 3.

An electrically insulating layer 31 (first electrically insulating layer) and a protection layer 32 (second electrically insulating layer) are laminated on the main mounting surface of the surface acoustic wave device 20 while avoiding the active region 24, so that the layers are provided as an electrically insulating layer containing an electrically insulating resin as a main component. That is, an electrically insulating layer 31 having a thickness of about 5 $\mu$m and made of polyimide resin is provided on the main mounting surface so as to be shaped like a frame to enclose the active region 24. The electrically insulating layer 31 which is extended from part of the pads 33 to the outside of the pads is formed, for example, by patterning of a light-sensitive polyimide resin. A protection layer 32 having a thickness of about 20 $\mu$m and made of polyimide resin is provided to cover an upper portion of the active region 24 by use of the frame-like electrically insulating layer 31 as a spacer, so that a closed space is formed on the active region 24. This protection layer 32 is formed, for example, by lamination of light-sensitive dry films on the electrically insulating layer 31. The protection layer 32 covers the active region 24 through the space on the active region 24. Preferably, a clean non-oxidizing or inert gas is enclosed in the closed space, which covers the active region 24.

The bump electrodes 22 provided as external electrodes serve as junction electrodes. The bump electrodes 22 are disposed in an edge portion (that is, a frame-like portion which encloses the active region 24) of the electrically insulating layer composed of the electrically insulating layer 31 and the protection layer 32. The bump electrodes 22 are provided in the inside of holes 34 which are formed to have an inner diameter of about 10 $\mu$m through the edge portion of the electrically insulating layer 31 and the protection layer 32. In this case, the bump electrodes 22 are made to come in close contact with the electrically insulating layer 31 and the protection layer 32 which are formed as inner walls of the holes 34. This bump electrodes 22 are formed from a metal such as copper, nickel, gold, or the like, by a sputtering method, a vapor deposition method, an electrolytic through-hole plating method, or the like. One end of each of the bump electrodes 22 is electrically connected to the pad 33 formed on the main mounting surface 20a of the surface acoustic wave device 20 and further connected to the comb-like electrodes 23, the ground pattern not shown, etc. via the pad 33.

The process of facedown mounting a surface acoustic wave device 20 as the chip device in FIGS. 1 and 3 on a circuit substrate will be described below with reference to FIGS. 4A to 4D.

Figure 4A:
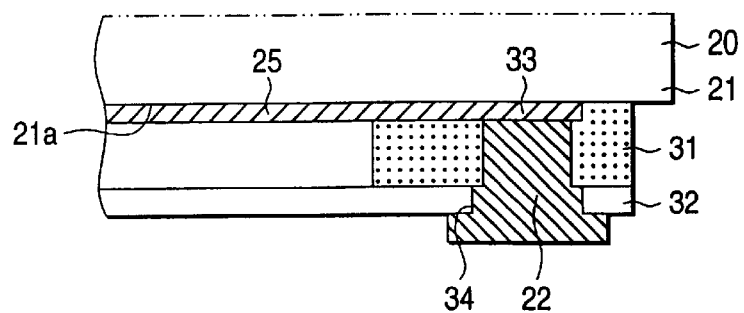
FIGS. 4A to 4D are enlarged sectional views showing the structure of the periphery of one of bump electrodes provided on the chip device and the procedure of facedown bonding.
Figure 4B:
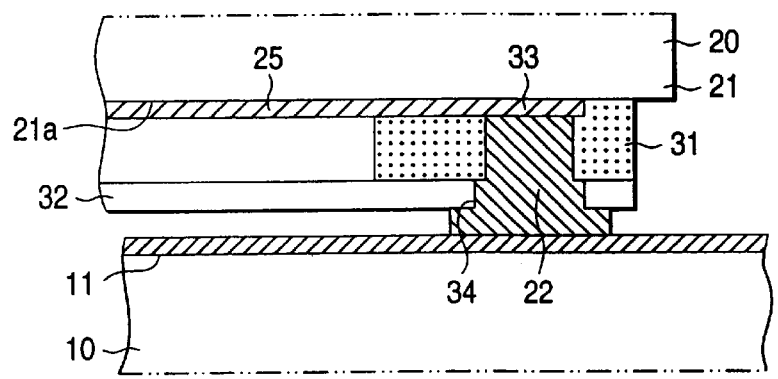
Figure 4C:
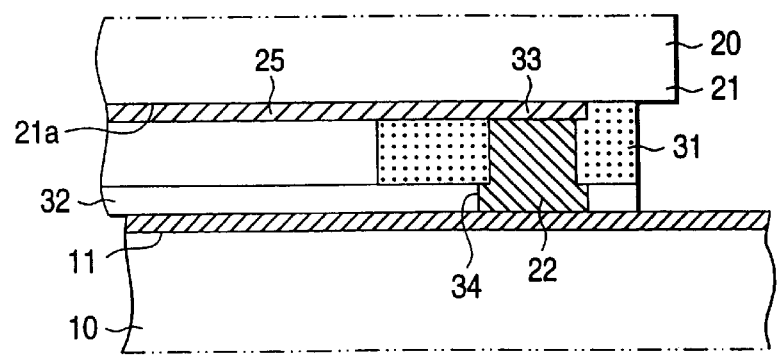

As shown in FIG. 4A, the surface acoustic wave device 20 has bump electrodes 22 which pierce the edge portion of the electrically insulating resin layer composed of the electrically insulating layer 31 and the protection layer 32. As shown in FIG. 4B, a conductor pattern 11 for mounting the surface acoustic wave device 20 is provided on the circuit substrate 10. The bump electrodes 22 of the surface acoustic wave device 20 are positioned in accordance with the position of the conductor pattern 11. Then, ultrasonic wave and pressing force are applied to the bump electrodes 22, for example, by an ultrasonic bonder. Thus, as shown in FIG. 4C, the bump electrodes 22, the electrically insulating layer 31 and the protection layer 32 are partially deformed so that the conductor pattern 11 of the circuit substrate 10 is brought into contact with and bonded to the bump electrodes 22. In this occasion, the electrically insulating layer 31 or the protection layer 32 is closely bonded to the circuit substrate 10 so that the surface acoustic wave device 20 is face-down bonded on the circuit substrate 10. Incidentally, the active region 24 is protected by the protection layer 32 through the closed space, so that the active region 24 is not influenced by bonding.

Figure 4D:
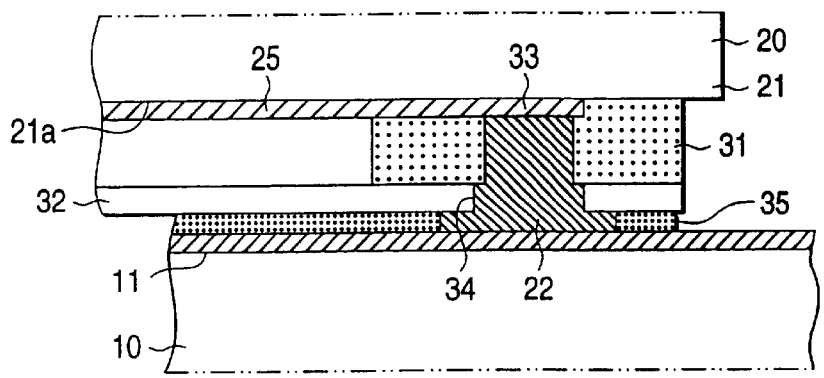
Figure 5A:
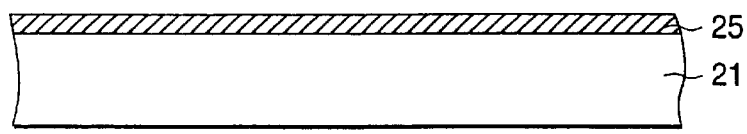
FIGS. 5A to 5F are explanatory views showing the procedure of producing the chip device.
Figure 5B:
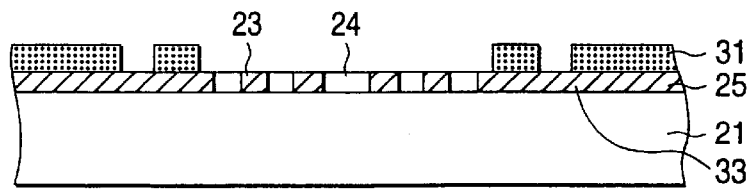
Figure 5C:
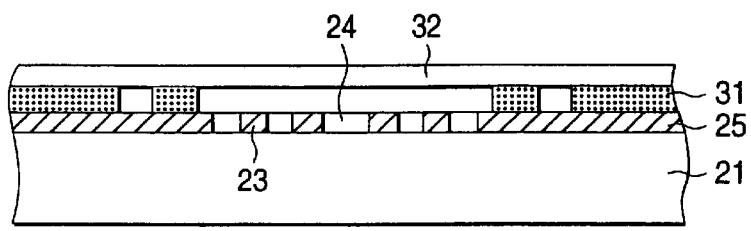
Figure 5D:
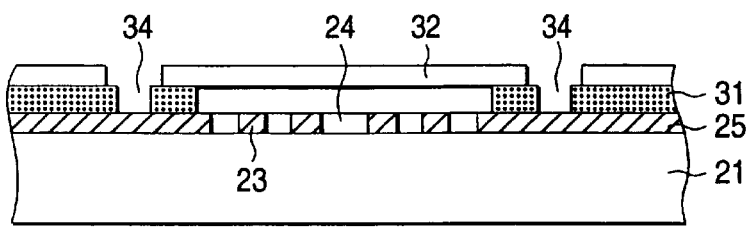
Figure 5E:
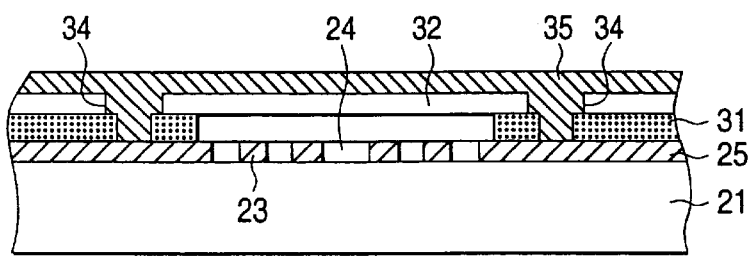
Figure 5F:
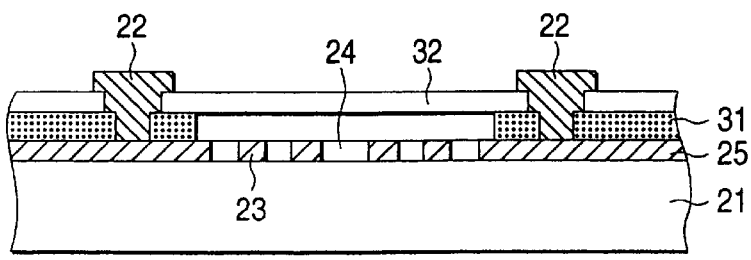

Further, when an adhesive agent (new adhesive resin layer) 35 is interposed between the protection layer 32 and the circuit substrate 10 as shown in FIG. 4D, the surface acoustic wave device 20 can be reinforced and fixed on the circuit substrate by use of adhesive force and contracting force peculiar to high molecules. When the adhesive agent 35 is used in combination, the protection layer may be omitted.

After the bump electrodes 22 are connected, by means of bonding, to the conductor pattern 11 of the circuit substrate 10 through opening portions from the electrically insulating layer 31 to the protection layer 32, as shown in FIG. 1, the upper portion of the surface acoustic wave device 20 face-down mounted thus is sealed and protected with a buffer resin 12 and an exterior resin 13 extended onto the circuit substrate, if necessary. The buffer resin 12 is constituted by silicone resin, or the like, for the double purpose of stress relaxation and electrical insulation. The exterior resin 13 is constituted by epoxy resin, or the like, for the main purpose of mechanical protection and enhancement of moisture resistance.

Referring to FIG. 5, a method for producing the surface acoustic wave device 20 as the chip device shown in FIGS. 1 to 4 will be described below. As shown in FIG. 5A, an electrode pattern (pattern for various electrodes and wiring) 25 having a thickness of from 500 to 2000 angstroms is formed, by aluminum vapor deposition, or the like, on a device substrate 21 which is a lithium tantalate monocrystalline substrate having a thickness of from 0.35 mm to 0.5 mm. Then, as shown in FIG. 5B, light-sensitive polyimide resin having a thickness of 5 $\mu$m is patterned and left, so that an electrically insulating layer 31 is formed. As shown in FIG. 5C, a protection layer 32 of polyimide resin having a thickness of 25 $\mu$m is laminated by use of the electrically insulating layer 31 as a spacer, so that a closed space is formed on the active region. Then, as shown in FIG. 5D, holes 34 each having an upper opening size of 20 $\mu$m are provided in the polyimide resin of the protection layer 32. Further, as shown in FIG. 5E, layers 35 of metals such as chrome, copper, nickel, gold, etc. (generally, chrome as the lowermost layer and gold as the uppermost layer) are accumulated by an electrolytic plating method, a vapor deposition method, or the like, so as to cover the upper surface. Incidentally, because the upper surface of the active region 24 on the main mounting surface side is sealed with the protection layer 32, there is a particular advantage that plating can be made. Then, as shown in FIG. 5F, the metal layers 35 are pattern-removed by etching, or the like, so that bump electrodes 22 each having an upper outer diameter of about 40 μm are formed.

According to this embodiment of the present invention, the following effects can be obtained.

Because the bump electrodes 22 as external electrodes are provided in the edge portions of the electrically insulating layer (electrically insulating resin layer in this embodiment) composed of the electrically insulating layer 31 and the protection layer 32, reduction in size of the shape of the chip device can be attained compared with the background-art chip device having the structure in which the bump electrodes are disposed in the outside of the dam frame or barriers.

Because the bump electrodes 22 are formed so as to be in contact with the edge portions of the electrically insulating layer and reinforced by the electrically insulating layer, the size of the bump electrodes 22 can be reduced. Further, when configuration is made so that the electrically insulating layer is brought into contact with and bonded to the circuit substrate at the time of face-down bonding to the circuit substrate 10 through the bump electrodes 22, the bonding strength between the bump electrodes 22 and the conductor pattern 11 of the circuit substrate can be enhanced.

Because not only the active region 24 is enclosed by the frame-like electrically insulating layer 31 but also the upper space of the active region 24 is closed by the protection layer 32, a closed space sealed against the air at a distance of 5 μm is formed on the active region 24. In the background art, when the surface acoustic wave device sealed by a glass casing, a ceramic package, or the like, is not blocked from the external environment, slight moisture or foreign matter is deposited on the surface of the active region to there by make the characteristic of the active region deteriorate. According to the configuration, in this embodiment of the present invention, however, no deterioration of characteristic in handling occurs because the active region 24 is covered and sealed with the protection layer 32. This effect is not limited to the embodiment using the surface acoustic wave device as an example. The same effect as described above is obtained also when the present invention is applied to a semiconductor chip.

Because a plurality of bump electrodes 22 are formed simultaneously by a thin-film technique and a film-forming technique such as plating, or the like, the heights of the plurality of bump electrodes 22 can be equalized.

In the aforementioned embodiment of the present invention, a method using a light-sensitive dry film has been described as an example of the method for forming a protection layer. Other than the aforementioned method, it is possible to employ any method in which, for example, holes are formed in advance in a bonding sheet using an adhesive polyimide film, or the like, before the sheet thus treated is bonded to the electrically insulating layer.

Alternatively, holes may be formed by use of a laser beam after a bonding sheet using an adhesive polyimide film, or the like, in which the holes have been not formed yet is bonded to the electrically insulating layer.

Further, an anisotropic electrically conductive sheet maybe used as the protection layer. In this case, the protection layer may be formed by attaching the anisotropic electrically conductive sheet to cover the electrically insulating layer and the bump electrodes after the electrically insulating layer is formed by patterning and the bump electrodes are formed. When the aforementioned chip device is mounted on the circuit substrate, the whole surface of the anisotropic electrically conductive sheet can be bonded. Accordingly, sealing characteristic free from air leakage is obtained.

Further, the aforementioned embodiment of the present invention has been described about the case where the leading head portion of each of the bump electrodes forms a flat surface. However, for example, the center portion of the leading head portion of each of the bump electrodes may be shaped to be hollow. Further, the aforementioned embodiment has been described about the case where the head portion of each of the bump electrodes is wider than its base portion. However, for example, each of the bump electrodes may be shaped so as to have an equal width from the base portion to the leading head portion.

When the configuration shown in the aforementioned embodiment of the present invention is used, the main mounting surface of the chip device is covered with the protection layer. Accordingly, various different bump materials such as solder, gold, electrically conductive resin, etc. can be used for the bump electrodes of the chip device. Furthermore, various connection means such as cream solder, electrically conductive resin, ultrasonic gold bonding, etc. can be used. As a result, when various kinds of chip devices are to be mounted onto one and the same circuit substrate, the various kinds of chip devices can be mounted onto the one and the same circuit substrate simultaneously by various bonding method so that, for example, one chip device is mounted by soldering and another chip device is mounted by use of an electrically conductive adhesive agent. Furthermore, the atmosphere and temperature, the reflow condition, the ultrasonic bonding condition, etc. at the time of bonding can be selected widely. That is, according to the present invention, there is produced an excellent effect that a plurality of different chip devices are MCM-mounted (MCM: multi-chip module) onto one and the same circuit substrate freely and easily.

Incidentally, after the chip device according to the embodiment of the present invention is MCM-mounted onto the circuit substrate, the whole of the chip device can be also covered with the exterior resin. Accordingly, various changes can be made so that, for example, the protection layer is omitted or simplified and the outside of the chip device is finally sealed with resin.

Although the embodiment of the present invention has been described above, it will be self-evident to those skilled in the art that the present invention is not limited thereto but various modifications and changes may be made within the scope of Claims.

As described above, according to the present invention, external electrodes are provided so as to come in close contact with the edge portions of the electrically insulating layer provided on the main mounting surface of the chip device to be face-down mounted onto the mount-side substrate. Accordingly, the size of the chip device can be reduced. Furthermore, there can be provided the chip device which has high reliability and in which high-density mounting can be made. Further, a surface acoustic wave device excellent in reliability and small in size can be provided by application of the present invention to the surface acoustic wave device.

Further, in the producing method according to the present invention, there are provided the electrically insulating layer formation step and the external electrode formation step of producing external electrodes so that the external electrodes come in contact with the electrically insulating layer. Accordingly, there is an effect that the chip device having small external electrodes can be formed.

What is claimed is:

1. A method for producing a chip device comprising the steps of:

forming an electrode pattern and an active region on a main mounting surface of a device substrate;

forming at least one electrically insulating layer with on at least a part of said main mounting surface to form a frame body and to expose at least a part of said electrode pattern;

forming external electrodes after forming said frame body so that one end of each of said external electrodes is connected to said electrode pattern while said external electrodes are in contact with said edge portions of said electrically insulating layer; and said insulating layer is interposed between said main mounting surface and a mount-side base substrate while not extending completely under said active region.

2. A method for producing a chip device according to claim 1, wherein said method further comprises a face-down mounting step of bonding said external electrodes to a mount-side substrate to thereby perform face-down mounting after the external electrode formation step, so that not only said external electrodes are connected to a conductor pattern of said mount-side substrate but also said electrically insulating layer is brought into close contact with both said main mounting surface and the surface of said mount-side substrate in said face-down mounting step.

3. A method for producing a chip according to claim 1, wherein said electrical insulating layer is formed on the main mounting surface before the electrode pattern is connected to the external electrode.

4. A method for producing a chip device comprising the steps of:

forming an electrode pattern and an active region on a main mounting surface of a device sustrate;

forming at least one electrically insulating layer on at least a part of said main mounting surface to form a frame body and to expose at least a part of said electrode pattern;

forming external electrodes after forming said at least one electrically insulating layer so that one end of each of said external electrodes is connected to said electrode pattern while said external electrodes are in contact with said edge portions of said electrically insulating layer, said insulating layer is interposed between said main mounting surface and a mount-side base substrate while not extending completely under said active region.

5. A method for producing a chip device according to claim 4, wherein said method further comprises a face-down mounting step of bonding said external electrodes to said mount-side substrate to thereby perform face-down mounting after the external electrode formation step, so that not only said external electrodes are connected to a conductor pattern of said mount-side substrate but also said electrically insulating layer is brought into close contact with both said main mounting surface and the surface of said mount-side substrate in said face-down mounting step.

6. A method for producing a chip device according to claim 4, wherein said electrical insulating layer is formed on the main mounting surface before the electrode pattern is connected to the external electrode.

* * * * *